US012027676B2

(12) United States Patent
Meyer-Teruel et al.

(10) Patent No.: US 12,027,676 B2
(45) Date of Patent: Jul. 2, 2024

(54) POWERTRAIN SYSTEM WITH WIRELESS COMMUNICATION NODES AND INTEGRATED RF SHIELD GUIDE LAYER

(71) Applicant: GM GLOBAL TECHNOLOGY OPERATIONS LLC, Detroit, MI (US)

(72) Inventors: Fiona E. Meyer-Teruel, Detroit, MI (US); Aseim M. Elfrgani, Sterling Heights, MI (US); Christopher A. O'Brien, Royal Oak, MI (US); Sony Mathews, Macomb, MI (US); Hatem Elgothamy, Westland, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 460 days.

(21) Appl. No.: 17/547,310

(22) Filed: Dec. 10, 2021

(65) Prior Publication Data

US 2023/0187712 A1 Jun. 15, 2023

(51) Int. Cl.

| | |
|---|---|
| ***H05K 1/14*** | (2006.01) |
| ***B60K 1/04*** | (2019.01) |
| ***B60L 53/20*** | (2019.01) |
| ***H01M 10/42*** | (2006.01) |
| ***H01M 10/48*** | (2006.01) |
| ***H01M 50/209*** | (2021.01) |
| ***H01M 50/249*** | (2021.01) |
| ***H01M 50/519*** | (2021.01) |
| ***H01M 50/569*** | (2021.01) |
| ***H01Q 1/52*** | (2006.01) |

(Continued)

(52) U.S. Cl.

CPC ........... *H01M 10/4257* (2013.01); *B60K 1/04* (2013.01); *B60L 53/20* (2019.02); *H01M 10/482* (2013.01); *H01M 50/209* (2021.01); *H01M 50/249* (2021.01); *H01M 50/519* (2021.01); *H01M 50/569* (2021.01); *H01Q 1/526* (2013.01); *H02K 7/006* (2013.01); *H02K 11/0094* (2013.01); *H02K 11/33* (2016.01); *H04B 7/24* (2013.01); *H05K 1/142* (2013.01); *H05K 9/006* (2013.01); *H05K 9/0084* (2013.01); *H01M 2010/4271* (2013.01); *H01M 2010/4278* (2013.01); *H01M 2220/20* (2013.01); *H05K 2201/10037* (2013.01); *H05K 2201/10098* (2013.01)

(58) Field of Classification Search

CPC ............ H01M 10/4257; H01M 50/519; H02K 11/33; B06L 53/20; H05K 1/142; H05K 9/006; H05K 2201/10037; H05K 2201/10098

USPC .......................................................... 361/792

See application file for complete search history.

(56) References Cited

U.S. PATENT DOCUMENTS

2017/0286903 A1* 10/2017 Elizondo, II ......... G06K 7/1413
2020/0113787 A1* 4/2020 Sirdeshmukh ........ A61J 7/0418

* cited by examiner

*Primary Examiner* — Binh B Tran
(74) *Attorney, Agent, or Firm* — Quinn IP Law

(57) ABSTRACT

An enclosed electrical device such as a battery pack for an electric powertrain system includes an enclosure having a tray and cover. The tray and cover together define an enclosure cavity. A radio frequency (RF) receiving node is located within the cavity. Printed circuit board assemblies (PCBAs) include an RF transmitting node. The PCBAs(s) are spaced apart from one another within the cavity. An RF shield guide layer is positioned between the PCBAs and the cover, such that the RF shield guide layer covers the PCBAs without covering the RF transmitting node. A battery pack and an electric powertrain system include the RF shield guide layer.

20 Claims, 4 Drawing Sheets

(51) Int. Cl.

| | |
|---|---|
| ***H02K 7/00*** | (2006.01) |
| ***H02K 11/00*** | (2016.01) |
| ***H02K 11/33*** | (2016.01) |
| ***H04B 7/24*** | (2006.01) |
| ***H05K 9/00*** | (2006.01) |

POWERTRAIN SYSTEM WITH WIRELESS COMMUNICATION NODES AND INTEGRATED RF SHIELD GUIDE LAYER

INTRODUCTION

A printed circuit board assembly (PCBA) may be equipped with a radio frequency (RF)-capable integrated circuit and suitable receiver and/or transmitter antennas to enable wireless communication by the PCBA with one or more additional devices.

Electrical components have traditionally communicated with each other via the transmission of electronic signals over copper wiring or other physical transfer conductors. In lieu of a direct hardwired setup, modern wireless systems instead broadcast radio frequency (RF) signals to communicate information. The RF spectrum is divided into bands, with each defined band having a corresponding use. In general, frequencies of 3-30 Hz ("extremely low frequency/ELF") fall at the low end of the RF spectrum, with frequencies of 300 GHz ("extremely high frequency/EFF") falling at the opposite extreme. Within this range, a host of long range to very near range wireless communications is enabled, including but not limited to short range technologies such as BLUETOOTH and near-field communication (NFC) at 2.45 GHz and 13.56 MHz, respectively.

The evolution of different wireless technologies has benefitted a myriad of applications. In a high-voltage propulsion battery pack, for instance, individual electrochemical battery cells are connected together and secured within a battery housing. In such a configuration, a cell sense board (CSB) may be joined to the battery cells and used to measure cell voltages, currents, temperatures, and other battery performance values. The CSB may be equipped with an RF circuit, such that the measured battery performance values are wirelessly transmitted to a battery controller as radio signals. As this occurs over wireless pathways, RF-capable battery packs are able to reduce or eliminate physical transfer conductor hardware and the packaging volume and weight typically associated therewith.

SUMMARY

An electrical device in accordance with the present disclosure includes an enclosure, a defined enclosed cavity of which includes a thin layer of material performing a radio frequency (RF) shielding and guiding function as set forth below. This interposed layer, which due to its dual functionality is referred to hereinafter as an "RF shield guide" layer, is constructed and positioned within an enclosure to facilitate effective use of multiple RF transmitters within the enclosure cavity. The enclosure includes a tray and a cover. For the purpose of illustration, the electrical device is exemplified herein as a propulsion battery pack in which multiple battery cells, possibly but not necessarily grouped into individual battery modules, are supported by the tray and contained within the above-noted enclosure cavity. Other possible embodiments of the electrical device may be contemplated by those skilled in the art, e.g., security or other monitoring systems, alarm circuits, signal relay stations, and the like, and therefore the representative propulsion battery pack is just one possible implementation of the present teachings.

As recognized herein, RF signal fidelity may at times become degraded in certain operating environments due to signal interference, close proximity of competing transmitters, and other factors, including possible nefarious actions such as hacking or jamming. Additionally, packaging constraints often dictate a given design, such as a "pancake" style battery pack for low-profile integration with a motor vehicle chassis, e.g., under a floor panel. A particularly challenging RF environment exists when the electrical enclosure contains multiple RF transmitting nodes, which in turn communicate with an RF receiving node located somewhere within the enclosure cavity. As appreciated in the art, delicate electrical components are often housed within such an enclosure to prevent ingress of moisture, dirt, and debris. Secure enclosures also help protect users from inadvertent contact with the multitude of electrical components housed within the enclosure cavity. RF signal transmission within such enclosure may be further complicated by the existence of sharp corners or signal impeding structural features. The present RF shield guide layer is therefore intended to improve the overall fidelity of RF signals in such a challenging RF environment, as well as to make the overall construction more secure against actions such as jamming or hacking.

In a representative embodiment, the cover and tray together define the enclosure cavity, within which is located an RF receiving node. The electrical device also includes a plurality of printed circuit board assemblies (PCBAs), each of which in turn may include a respective RF transmitting node, e.g., a transmitting antenna. The RF transmitting node may be arranged proximate one of the side walls, on top of the PCBAs or modules, or at other suitable locations. The PCBAs as envisioned herein are, in some embodiments, spaced a short distance apart from one another within the enclosure cavity by a first plurality of gaps. A perimeter edge of the PCBAs is spaced apart from the side walls by a second plurality of gaps, e.g., in a grid-like fashion in a non-limiting embodiment.

The electrical device further includes the RF shield guide layer. The RF shield guide layer is positioned between the PCBAs and the cover, such that the RF shield guide layer covers the PCBAs without also covering the RF transmitting nodes. In this manner, the structure and relative placement of the RF shield guide layer optimizes transmission of an RF signal to the RF receiving node by the respective RF transmitting nodes.

The RF shield guide layer may be constructed from metal in some embodiments. For example, the metal may include one or more of aluminum, copper, nickel, zinc, silver, or gold in different representative embodiments. The RF shield guide layer may be constructed entirely of the metal, or of alloys thereof, or using a composite material suitable for performing the disclosed shielding and guiding functions. In some implementations, the metal may include a thin metal foil, with "thin" in this instance meaning a thickness of less than about 50 microns, or possibly 25 microns or less in another implementation. A thermal layer may be used in conjunction with the metal for optimal shielding capability, or alone with a suitable guiding capability but a reduced shielding capability. Exemplary materials include silica fiber or other low-loss materials.

The RF receiving node in some embodiments includes an RF antenna of an electronic control unit for regulating operation of the electrical device, e.g., a battery management system for regulating operation of a battery pack.

Each respective one of the PCBAs may include, as the respective RF transmitting node, an RF antenna in communication with the RF receiving node, with the communication occurring via an RF signal transmission path extending around the RF shield guide layer. In an aspect of the disclosure, the RF shield guide layer defines windows or other through-openings within which is disposed a respective ones of the RF transmitting nodes.

A plan view perimeter of the enclosure is rectangular in some non-limiting embodiments, while in other embodiments the perimeter may have a different shape, such as a curvilinear shape. Thus, the present teachings may benefit battery packs and other systems of a wide range of different shapes.

In the exemplary and non-limiting case of the rectangular shape, each respective one of the PCBAs may be a component of a battery module in a representative battery pack construction of the electrical device.

Another aspect of the disclosure includes an electric powertrain system having a traction power inverter module (TPIM) and a polyphase rotary electric machine connected to the TPIM. The electric machine in turn includes a rotatable output member coupled to a driven load, e.g., road wheels of a motor vehicle. The powertrain system includes a battery pack having a battery enclosure, inclusive of a battery tray and a battery cover. The battery tray may include, in an exemplary configuration, a floor surrounded by multiple side walls, such that the floor, the enclosure cover, and the side walls collectively define an enclosure cavity.

In this embodiment, an RF receiving node located somewhere within the enclosure cavity is part of an electronic control unit for the battery pack. Battery modules are spaced apart from one another within the enclosure cavity by a first plurality of air gaps, with a perimeter edge of the plurality of battery modules being spaced apart from the multiple side walls by a second plurality of air gaps. Each respective one of the battery modules includes one or more electrochemical battery cells and a PCBA connected to the one or more electrochemical battery cells. The PCBAs each have an RF transmitting node.

The above features and advantages, and other features and attendant advantages of this disclosure, will be readily apparent from the following detailed description of illustrative examples and modes for carrying out the present disclosure when taken in connection with the accompanying drawings and the appended claims. Moreover, this disclosure expressly includes combinations and sub-combinations of the elements and features presented above and below.

DETAILED DESCRIPTION

Figure 1:
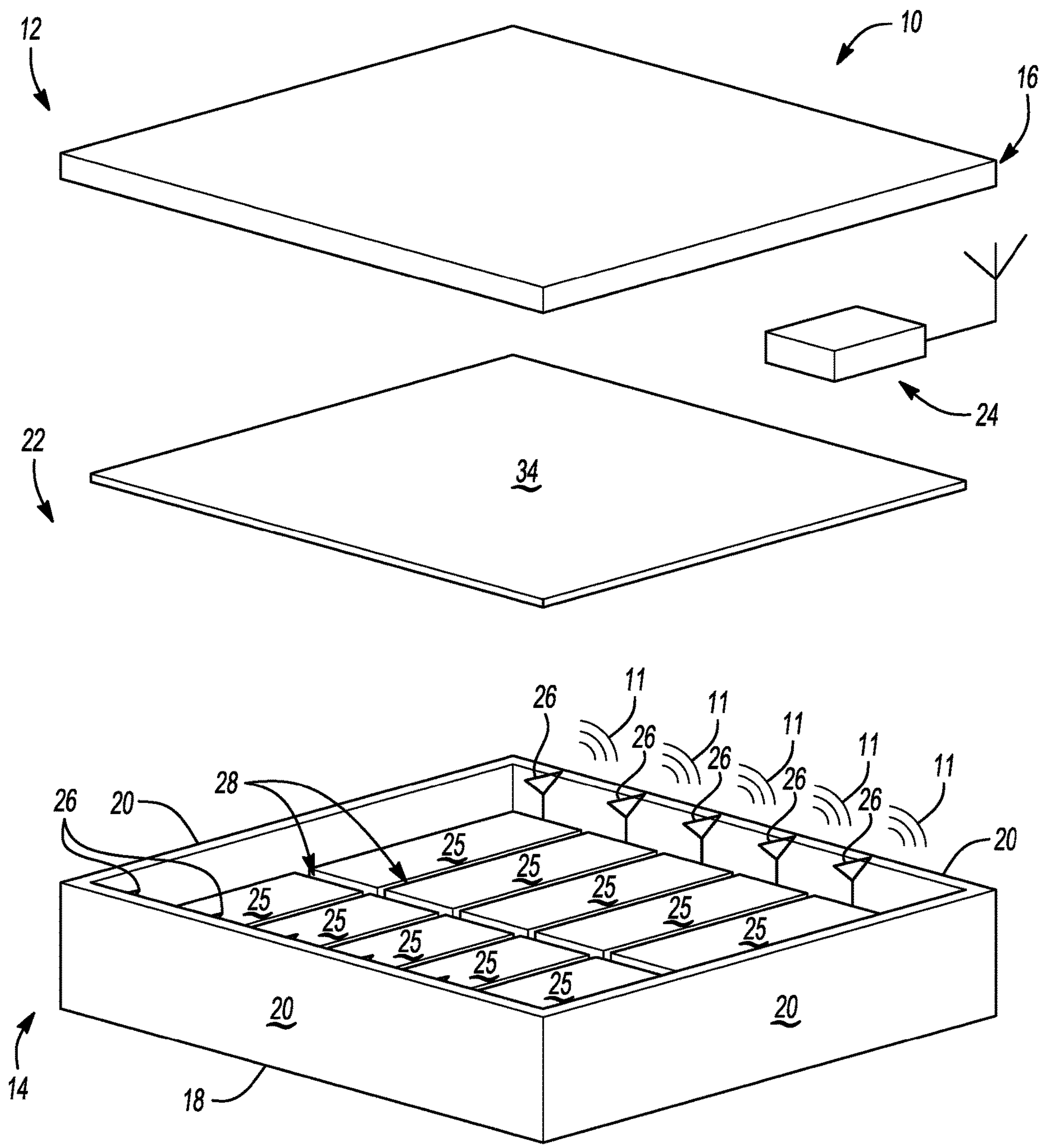
FIG. 1 is an exploded view illustration of a representative electrical device having a non-porous radio frequency (RF) shielding and guiding layer constructed and arranged in accordance with the present disclosure.

The present disclosure is susceptible of embodiment in many different forms. Representative examples of the disclosure are shown in the drawings and described herein in detail as non-limiting examples of the disclosed principles. To that end, elements and limitations described in the Abstract, Introduction, Summary, and Detailed Description sections, but not explicitly set forth in the claims, should not be incorporated into the claims, singly or collectively, by implication, inference, or otherwise.

For purposes of the present description, unless specifically disclaimed, use of the singular includes the plural and vice versa, the terms "and" and "or" shall be both conjunctive and disjunctive, "any" and "all" shall both mean "any and all", and the words "including", "containing", "comprising", "having", and the like shall mean "including without limitation". Moreover, words of approximation such as "about", "almost", "substantially", "generally", "approximately", etc., may be used herein in the sense of "at, near, or nearly at", or "within 0-5% of", or "within acceptable manufacturing tolerances", or logical combinations thereof.

Referring to the drawings, wherein like reference numbers refer to like features throughout the several views, FIG. 1 depicts an electrical device 10 having an enclosure 12. The enclosure 12 in turn includes a tray 14 and a cover 16. The tray 14 has a floor 18 surrounded by multiple side walls 20, such that the floor 18, the cover 16, and the multiple side walls 20 collectively define an enclosure cavity 22. The electrical device 10 also includes a plurality of printed circuit board assemblies (PCBAs) 25, with each PCBA 25 being positioned within the enclosure cavity 22. For illustrative consistency and simplicity, the enclosure 12, the tray 14, and the cover 16 are depicted as having a rectangular shape. However, other shapes and configurations may be readily envisioned within the scope of the disclosure, including curvilinear, irregularly shaped, round, or oval shapes, and therefore the depicted shapes and configurations are not intended to be limiting of the present teachings.

As part of the proposed construction, the PCBAs 25 include a respective radio frequency (RF) transmitting node (Tx) 26. Each RF transmitting node 26 may in some instances be arranged proximate one of the multiple side walls 20 as shown, on top of the PCBAs 25 and situated within a corresponding through-hole window 65, or at another suitable location. The PCBAs 25 are spaced apart from one another within the enclosure cavity 22 by a first plurality of gaps 28. A perimeter edge 30 (see FIG. 2) of the PCBAs 25 is spaced apart from the multiple side walls 20 by a second plurality of gaps 32 in this particular embodiment. An RF receiving node (Rx) 24 is positioned within the enclosure cavity 22 in wireless communication with the RF transmitting nodes 26, with the particular location of the RF receiving node 24 possibly varying with the given application.

Such communication occurs over wireless communications pathways within the enclosure cavity 22 using suitable communications protocols, e.g., a Wi-Fi protocol using a wireless local area network (WLAN), IEEE 802.11, a 3G, 4G, or 5G cellular network-based protocol, BLUETOOTH, BLE BLUETOOTH, and/or other suitable protocol. Additional or alternate communication methods, such as a dedicated short-range communications (DSRC) channel, near field communication (NFC), etc., are also considered within the scope of the present disclosure. As appreciated in the art, DSRC channels refer to one-way or two-way short-range to medium-range wireless communication channels specifically designed for automotive use and a corresponding set of protocols and standards. However, the presence within the enclosure cavity 22 of a potentially large number of different RF transmitting nodes 26, along with the various other structural elements of the electrical device 10, may lead to degraded RF signal fidelity due to, e.g., signal interference, close proximity of competing RF transmitting nodes 26, and other factors as noted above. Nefarious efforts such as attempted hacking or jamming from outside of the electrical device 10 can also occur. Collectively, these factors create a challenging RF signal environment.

To address this problem, the electrical device 10 of FIG. 1 includes a thin RF shield guide layer 34, which in turn is positioned between the PCBAs 25 and the enclosure cover 16. The RF shield guide layer 34 is arranged to cover the PCBAS 25 without also covering the RF transmitting nodes 26. For example, the RF shield guide layer 34 may cover the first plurality of gaps 28 without also covering the second plurality of gaps 32, thereby optimizing transmission of RF signals to the RF receiving node 24 by the respective RF transmitting node 26 of each of the PCBAs 25. When the RF transmitting nodes 26 are positioned on top of the PCBAs 25, the RF shield guide layer 34 may define the above-noted windows 65, such that a clear pathway exists between the RF transmitting nodes 26 and the RF receiving node 24. That is, the RF shield guide layer may define a plurality of the windows 65, and the RF transmitting node 26 of each respective one of the PCBAs 25 may be positioned in a respective one of the windows 65. In a possible configuration, the RF shield guide layer 34 is constructed entirely or substantially from metal, e.g., at least 80% of the material(s) of the RF shield guide layer 34 are an elemental metal or an alloy thereof. In other embodiments the RF shield guide layer 34 may be constructed from a thermal barrier material, e.g., silica fiber or another dielectric or low-loss material.

The metal in this instance may include a non-porous layer of one or more of aluminum, copper, nickel, zinc, silver, or gold, or another application-suitable metal. Metamaterials, composites, or other application suitable materials may be used in other embodiments. When metal is used to construct the RF shield guide layer 34, the metal may be in the form of a thin metal foil, with "thin" being a thickness of less than about 50 microns in a possible embodiment.

Figure 2:
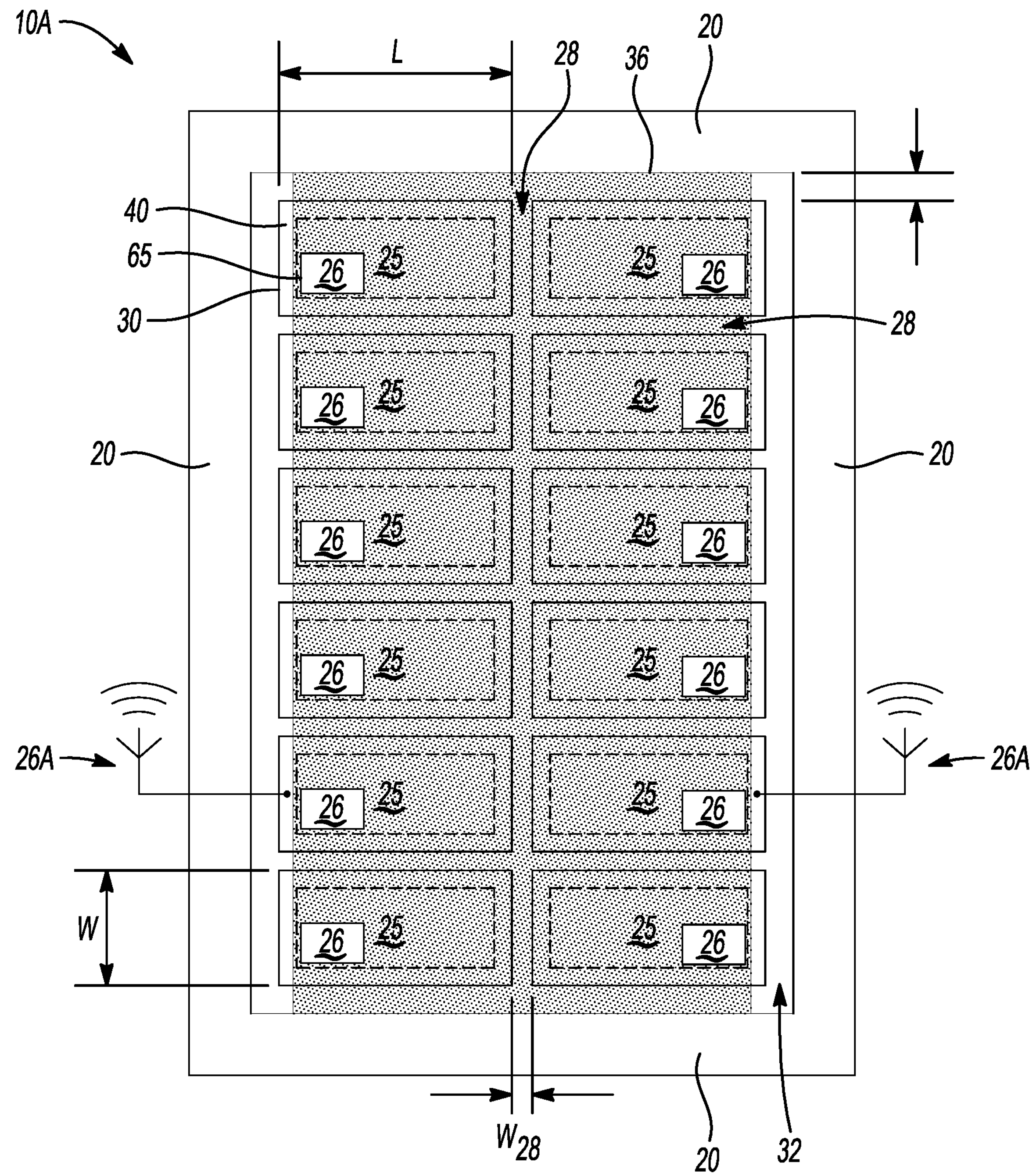
FIG. 2 is a schematic plan view illustration of the electrical device of FIG. 1 according to an exemplary battery electric embodiment.

Referring to FIG. 2, each respective one of the PCBAs 25 may be a component of a battery module 40. In the non-limiting illustrated embodiment, the battery module 40 has a width dimension (W) that is parallel to a first pair of the multiple side walls 20, and a length dimension (L) that is parallel to a second pair of the multiple side walls (20). Optionally, a perimeter of the enclosure 12 of FIG. 1 thus may be rectangular, such that the first plurality of gaps 28 of a width W28 are linear, and are parallel to two of the side walls 20, and such that the second plurality of gaps 32 are parallel to the other two of the side walls 20. A top-down/plan view perimeter of the enclosure 12, as shown in FIGS. 1 and 2, is rectangular in some embodiments, such that the first plurality of gaps 28 are arranged at right angles to the second plurality of gaps 32. Non-rectangular shapes may also be readily envisioned as noted above. For instance, the battery module 40 may have a curvilinear perimeter, or an irregular shape, and thus the shape of the battery module 40 and other structure may be expected to vary with the intended end use. In any or all of such possible constructions, the PCBAs 25 described herein may be mounted either on top of or on the side of the battery modules 40.

Each respective one of the PCBAs 25 includes, as the respective RF transmitting node 26 of FIG. 1, an RF antenna 26A in communication with the RF receiving node 24 of FIG. 1. For simplicity, FIG. 2 illustrates two of the RF antennas 26A, with each of the remaining RF transmitting nodes 26 being similarly equipped with a corresponding RF antenna 26A. This occurs via an RF signal transmission path 11 extending, e.g., around a perimeter edge 36 of the RF shield guide layer 34. In a representative embodiment, the electrical device 10 of FIG. 1 may be constructed as a battery pack 10A, for instance a high-voltage lithium ion propulsion battery for an electric or hybrid electric vehicle. The RF receiving node 24 in this exemplary embodiment is an RF antenna of an electronic control unit 240 for the battery pack 10A, sometimes referred to as battery management system (BMS).

Although omitted for illustrative simplicity, the electronic control unit 240 in such an embodiment may be equipped with application-specific amounts of volatile and non-volatile memory, one or more processor(s), and associated hardware such as a digital clock or oscillator, input/output circuitry, buffer circuitry, Application Specific Integrated Circuits (ASICs), systems-on-a-chip (SoCs), electronic circuits, and other requisite hardware needed to provide the programmed functionality. In the context of the present disclosure, the electronic control unit 240 may execute instructions via the processor(s) to cause the electronic control unit 240 to receive measured battery parameters from the various RF transmitting nodes 26, e.g., the RF antennas 26A of FIG. 2. The electronic control unit 240 may thereafter use the received information, such as cell voltages, currents, temperatures, or the like, when regulating operation of the propulsion battery pack 10A.

In a representative configuration of the battery pack 10A shown in FIG. 2, a plurality of battery modules 40 is spaced apart from one another within the component cavity 22 of FIG. 1 by the first plurality of gaps 28. Each battery module 40 in this embodiment includes one or more electrochemical battery cells (not shown). The PCBA 25, in this instance a cell sense board operable for measuring and reporting one or more battery cell parameters for one or more battery cells to the electronic control unit 240 via the RF transmitting nodes 26.

To this end, the PCBAs 25 are conductively connected to the positive (+) and negative (−) electrodes of the constituent battery cells (not shown) of a given one of the battery modules 40, as appreciated in the art. The RF shield guide layer 34 in this particular embodiment may be positioned between the battery modules 40 and the enclosure cover 16 of FIG. 1, such that the RF shield guide layer 34 covers the first plurality of gaps 28 without also covering the second plurality of gaps 32 along the side walls 20 forming the lengthwise dimension of the battery pack 10A in the illustrated embodiment. More specifically, the RF shield guide layer 34 covers the PCBAs 25 without also covering the RF transmitting nodes 26. Thus, while shown a distance apart from the side walls 20 for illustrative clarity, the RF shield guide layer 34 may approach closer to the side walls 20 than depicted in FIG. 2, or may reach the side walls 20 when the RF transmitting nodes 26 are positioned on top of the PCBAs 25 within the optional windows 65. In this manner, placement of the RF shield guide layer 34 optimizes transmission over the RF pathway 11 of RF signals to the RF receiving node 24 by the respective RF transmitting nodes 26 of each of the PCBAs 25. The RF shield guide layer 34 has a shield surface area, shape, and geometry sufficient for ensuring that the PCBAs 25 and gaps 28 are covered, outside of the RF transmitting nodes 26 which are left uncovered. "Covered" in this context may entail the RF shield guide 34 being coextensive with at least 80% to 90% or more of the total surface area of the gaps 28 in top-down/plan view (FIG. 2), such that the RF shield guide layer 34 does not impede intended signal transmissions by the RF transmitting nodes 26.

Figure 3:
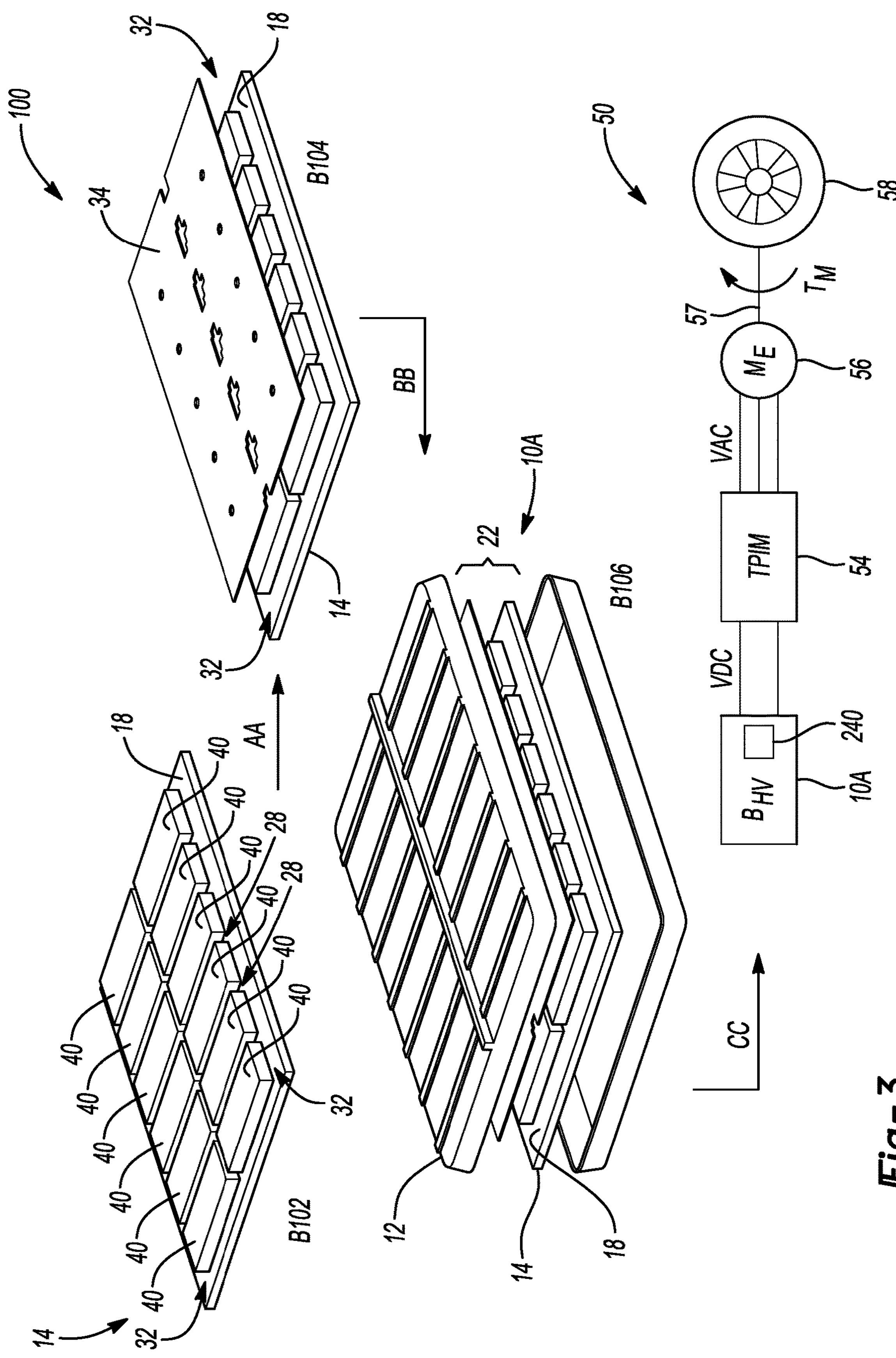
FIG. 3 is a flow diagram describing a method for constructing the electrical device of FIG. 2.

Referring to FIG. 3, the battery pack 10A of FIG. 2 having an electronic control unit (240) as the RF receiving node 24 shown in FIG. 1 may be constructed in accordance with a method 100. Beginning at block B102, the method 100 may include arranging a plurality of battery modules 40 on the floor 18 of the tray 14 such that the battery modules 40, themselves inclusive of a respective one of the PCBAs 25 of FIG. 2, are arranged in a grid-like pattern as shown. The battery modules 40 in an actual embodiment may have a greater height relative to the floor 18, and thus the illustrated battery modules 40 do not necessarily represent actual proportions. Likewise, the side walls 20 of FIG. 1 have been omitted for illustrative clarity, e.g., to better illustrate the gaps 32. For ease of manufacturing, thermal management, and other purposes, the battery modules 40 are spaced apart from one another by the above-noted gaps 28 and 32, as best shown in FIG. 2. Once the battery modules 40 are arranged as shown, the method 100 proceeds to block B104, as indicated by arrow AA.

Block B104 entails positioning the RF shield guide layer 34 between the plurality of battery modules 40 and the enclosure cover 16 (see block B106), such that the RF shield guide layer 34 covers the first plurality of gaps 28 without also covering the second plurality of gaps 32. In this way, the RF shield guide layer 34 exposes the outer perimeter edge of the battery modules 40, when the RF transmitting nodes 26 of each of the PCBAs 25 reside there, as best shown in FIG. 2. In other embodiments the RF transmitting nodes 26 are located on top of the PCBAs 25, in which case the RF shield guide layer 34 may reach the outer perimeter edge as noted above. At block B104, assembly according to the method 100 may include fastening the RF shield guide layer 34 to the battery modules 40 and/or to the tray 14, e.g., using threaded fasteners, adhesives, or other suitable techniques. The method 100 then proceeds to block B106 as indicated by arrow BB.

Block B106 entails installing the cover 16 to the tray 14. For instance, threaded fasteners (not shown) may be used to securely clamp an outer perimeter edge of the cover 16 to a mating outer perimeter edge of the tray 14. The enclosure cavity 22 would then be sealed off from the surrounding environment, thus protecting the battery modules 40 and the PCBAs 25 thereof from dirt, moisture, and debris. The method 100 then proceeds as indicated by arrow CC to integrate the battery pack 10A into an electrical system, e.g., an electric powertrain system 50.

As part of the method 100, the assembled battery pack 10A once integrated into the electric powertrain system 50 may be used as a propulsion battery suitable for energizing vehicular propulsion functions. In an exemplary configuration, the electric powertrain system 50 includes a traction power inverter module (TPIM) 54 and a polyphase rotary electric machine ($M_E$) 56 connected to the battery pack 10A and the TPIM 54. The electric machine 56 includes a rotatable output member 57 that is coupled to a driven load, e.g., one or more road wheels 58. In the illustrated setup, a direct current voltage (VDC) from the battery pack 10A is provided to the TPIM 54, with pulse width modulation or other application suitable switching control techniques used therein to convert the direct current voltage to a polyphase/alternating current voltage (VAC) suitable for energizing the electric machine 56. Once energized in this manner, the electric machine 56 generates an output torque (arrow $T_M$), which in turn is directed to the road wheels 58.

Figure 4:
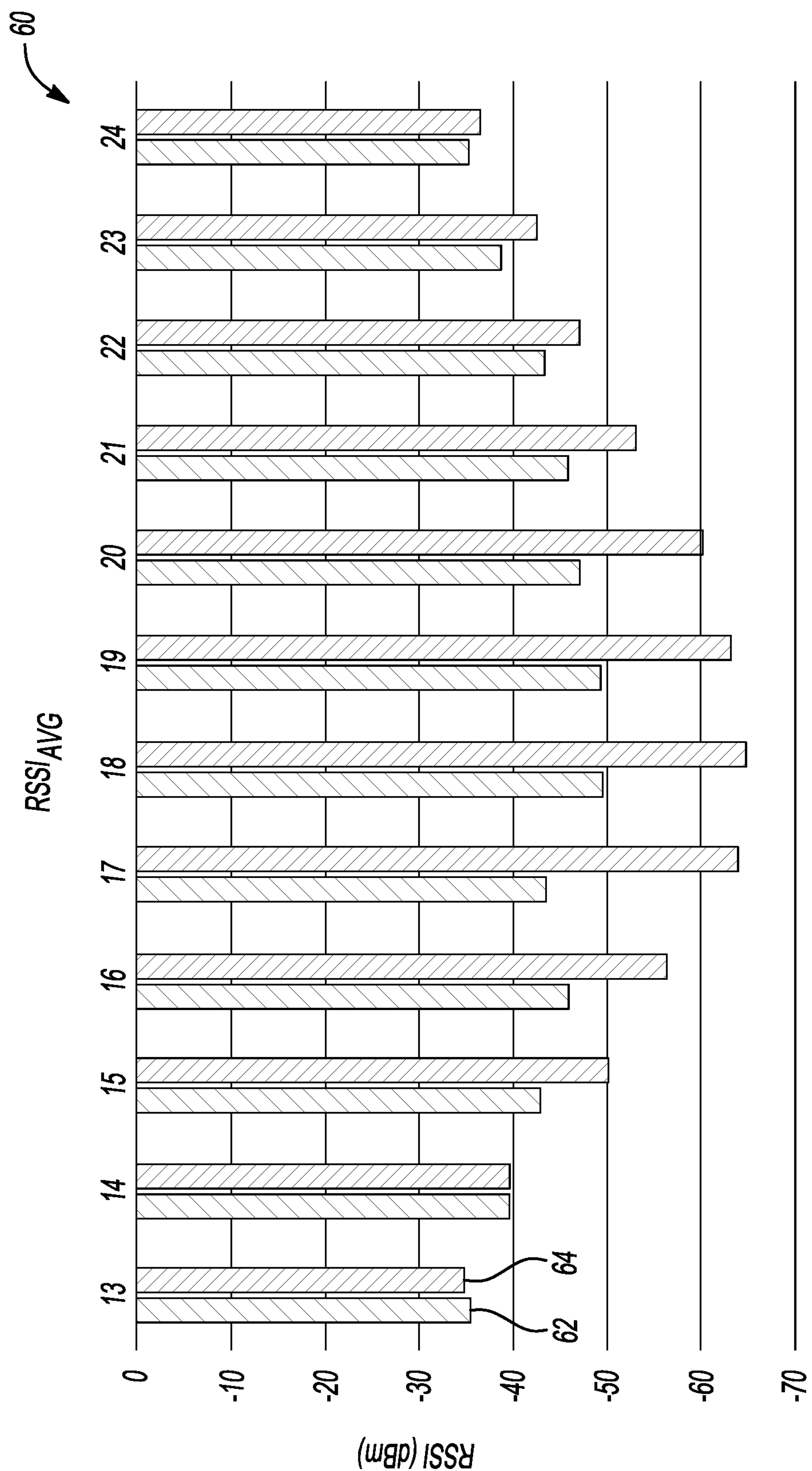
FIG. 4 is a plot of an effect of the present teachings on an average received signal strength (RSSI) of an RF signal received by an RF receiving node located within an enclosure of the representative embodiment of FIGS. 2 and 3.

Referring briefly to FIG. 4, a plot 60 is shown of a beneficial effect of the present teachings on an average received signal strength ($RSSI_{AVG}$) in dBm of an RF signal received by the RF receiving node 24 of FIG. 1 when located within the enclosure 12, e.g., of the representative battery pack 10A using twelve of the battery modules 40 arranged as shown in FIG. 2. Bars 62 of FIG. 4 represent the RSSI with the RF shield guide 34 installed as set forth above. In contrast, bars 64 show the RSSI in constructions in which the RF shield guide 34 is omitted. The battery modules 40 are nominally numbered 13-24 for the representative case of twelve battery modules 40. As the battery modules 40 located farthest from the RF receiving node 24 are most affected by the difficult RF signal environment described above, one sees negligible reduction in RSSI by using the RF shield guide 34 at those locations. As one moves farther away from the RF receiving node 24, however, the benefits become more pronounced, with a 10 dBm or greater improvement for the most distant of RF transmitting nodes 26.

As will be appreciated by those skilled in the art in view of the foregoing teachings, use of the RF shield guide layer 34 as part of the electrical device 10 or battery pack 10A of FIG. 1 or 2, respectively, may help to optimize transmission of RF signals to a remotely located RF receiving node 24 by the respective RF transmitting nodes 26A of each of the PCBAs 25. Rather than blocking the transmissions or acting as an EMI shield, the structure and placement of the RF shield guide 34 purposefully exposes just the perimeter edge of the PCBAs 25 or battery modules 40 containing the same, enabling a clear path for signal propagation to the RF receiving node 24. In this manner, RF signals are prevented from propagating through the various gaps 28 separating the PCBAs 25, thereby minimizing signal losses within the electrical device 10.

The attendant benefits are realized with minimal additional components, weight, and packaging space. Likewise, the present teachings benefit electrical devices 10 or battery packs 10A of different shapes and constructions, including non-rectangular and/or interlaced battery modules having cylindrical battery cells in which the PCBA is placed next to or integrated into the battery module to provide cell measurements as appreciated in the art. The present teachings may therefore be used to improve performance even when the above-described gaps 28 and 32 are uneven, and even where the shielded structure is nonrectangular.

The detailed description and the drawings or figures are supportive and descriptive of the present teachings, but the scope of the present teachings is defined solely by the claims. While some of the best modes and other embodiments for carrying out the present teachings have been described in detail, various alternative designs and embodiments exist for practicing the present teachings defined in the appended claims. Moreover, this disclosure expressly includes combinations and sub-combinations of the elements and features presented above and below.

What is claimed is:

1. An electrical device, comprising:

an enclosure having a tray and a cover that together define an enclosure cavity;

a plurality of printed circuit board assemblies (PCBAs), each of the PCBAs including a respective RF transmitting node;

a radio frequency (RF) receiving node located within the enclosure cavity; and an RF shield guide layer configured to cover each of the PCBAs without also covering the respective RF transmitting node thereof, such that the RF shield guide layer optimizes transmission of an RF signal to the RF receiving node by the respective RF transmitting node of each of the PCBAs.

2. The electrical device of claim 1, wherein the tray includes a floor surrounded by multiple side walls, the PCBAs are spaced apart from one another within the enclosure cavity by a first plurality of gaps, and a perimeter edge of the plurality of PCBAs is spaced apart from the multiple side walls by a second plurality of gaps, and wherein the RF shield guide layer covers the first plurality of gaps without covering the second plurality of gaps.

3. The electrical device of claim 1, wherein the RF shield guide layer is constructed from a non-porous metal.

4. The electrical device of claim 3, wherein the RF shield guide layer is constructed from the non-porous metal and a thermal barrier material.

5. The electrical device of claim 4, wherein the thermal barrier material includes a silica fiber material.

6. The electrical device of claim 3, wherein the non-porous metal includes one or more of aluminum, copper, nickel, zinc, silver, or gold.

7. The electrical device of claim 1, wherein the RF shield guide layer is constructed of a metal foil having a thickness of less than about 50 microns.

8. The electrical device of claim 1, wherein the RF receiving node is an RF antenna of an electronic control unit for the electrical device, and wherein each respective one of the PCBAs includes, as the respective RF transmitting node, an RF antenna in communication with the electronic control unit via an RF signal transmission path around the RF shield guide layer.

9. The electrical device of claim 1, wherein the RF shield guide layer defines a plurality of windows, and wherein the RF transmitting node of each respective one of the PCBAs is positioned in a respective one of the windows.

10. The electrical device of claim 1, wherein each respective one of the PCBAs is a component of a battery module.

11. A battery pack, comprising:

an enclosure having a tray and a cover, the tray including a floor surrounded by multiple side walls, such that the floor, the cover, and the multiple side walls collectively define an enclosure cavity;

a radio frequency (RF) receiving node located within the enclosure cavity, wherein the RF receiving node is part of an electronic control unit for the battery pack;

a plurality of electrochemical battery cells;

at least one printed circuit board assembly (PCBA) connected to the electrochemical battery cells and having an RF transmitting node, the PCBA being configured as a cell sense board operable for measuring and reporting one or more battery cell parameters to the electronic control unit via the RF transmitting node; and an RF shield guide layer positioned between the RF transmitting node and the cover, such that the RF shield guide layer covers the PCBA without covering the RF transmitting node thereof, thereby optimizing transmission of an RF signal to the RF receiving node by the RF transmitting nodes.

12. The battery pack of claim 11, wherein the tray includes a floor surrounded by multiple side walls, the at least one PCBA includes a plurality of PCBAs that are spaced apart from one another within the enclosure cavity by a first plurality of gaps, and a perimeter edge of the plurality of PCBAs is spaced apart from the multiple side walls by a second plurality of gaps, and wherein the RF shield guide layer covers the first plurality of gaps without covering the second plurality of gaps.

13. The battery pack of claim 11, wherein the RF shield guide layer is constructed from a non-porous metal.

14. The battery pack of claim 13, wherein the RF shield guide layer is constructed from the non-porous metal and a thermal barrier material.

15. The battery pack of claim 13, wherein the non-porous metal includes one or more of aluminum, copper, nickel, zinc, silver, or gold.

16. The battery pack of claim 15, wherein the aluminum, copper, nickel, zinc, silver, or gold is a metal foil having a thickness of less than about 50 microns.

17. The battery pack of claim 11, wherein the RF shield guide layer defines a window, and wherein the RF transmitting node is situated on top of the PCBA within the window.

18. The battery pack of claim 11, wherein the RF shield guide layer is constructed at least partially from a silica fiber material.

19. An electric powertrain system, comprising:

a traction power inverter module (TPIM);

a polyphase rotary electric machine connected to the TPIM, and having a rotatable output member coupled to a driven load; and a battery pack comprising:

a battery enclosure having a battery tray and a battery cover, the battery tray having a floor surrounded by multiple side walls, such that the floor, the enclosure cover, and the multiple side walls collectively define an enclosure cavity;

a radio frequency (RF) receiving node located within the enclosure cavity, wherein the RF receiving node is part of an electronic control unit for the battery pack;

a plurality of battery modules spaced apart from one another within the enclosure cavity by a first plurality of gaps, and having a perimeter edge spaced apart from the multiple side walls by a second plurality of gaps, each respective one of the battery modules including:

one or more electrochemical battery cells; and a printed circuit board assembly (PCBA) connected to the one or more electrochemical battery cells, and having an RF transmitting node arranged proximate one of the multiple side walls or on top of the PCBA; and an RF shield guide layer constructed at least partially of a non-porous metal and positioned between the PCBA and the battery cover, such that the RF shield guide layer covers the PCBA and the first plurality of gaps without covering the RF transmitting node and the second plurality of gaps, thereby optimizing transmission of an RF signal to the RF receiving node by the respective RF transmitting node of each of the PCBAs.

20. The electric powertrain system of claim 19, wherein RF shield guide layer includes a thermal barrier.

* * * * *